United States Patent [19]

Nishijima et al.

[11] 4,198,602
[45] Apr. 15, 1980

[54] LIMITER CIRCUIT FOR LIMITING PULSIVE NOISES

[75] Inventors: Hideo Nishijima; Isao Fukushima, both of Katsuta; Hiroyuki Kimura, Yokohama, all of Japan

[73] Assignee: Hitachi, Ltd., Japan

[21] Appl. No.: 934,717

[22] Filed: Aug. 21, 1978

[30] Foreign Application Priority Data

Aug. 23, 1977 [JP] Japan .................... 52-100858

[51] Int. Cl.$^2$ .................................... H04B 1/10
[52] U.S. Cl. .................... 455/307; 307/237; 455/308
[58] Field of Search ............. 325/482, 313, 477, 480, 325/182, 478, 319; 328/165, 167, 168, 169, 171; 307/237, 264; 329/130, 131, 134; 330/149, 126

[56] References Cited

U.S. PATENT DOCUMENTS

| | | | |
|---|---|---|---|
| 3,932,768 | 1/1976 | Takahashi et al. | 307/237 |
| 3,968,383 | 7/1976 | Smith | 328/165 X |
| 4,042,883 | 8/1977 | Rae | 325/482 X |

Primary Examiner—Marc E. Bookbinder
Assistant Examiner—Alexander Gerasimow
Attorney, Agent, or Firm—Craig and Antonelli

[57] ABSTRACT

A limiter circuit comprises a low-pass filter which passes only a modulation signal out of the modulation signal having pulsive noises superimposed thereon and circuit means for supplying the modulation signal extracted by the filter to current source circuits for a limiter differential amplifier to control the current source circuit for the limiter differential amplifier in accordance with a waveform of the input modulation signal applied thereto.

6 Claims, 22 Drawing Figures

INPUT SIGNAL
WAVEFORM $e_i$
(DEMODULATION SIGNAL)

CONTROL SIGNAL
WAVEFORM $V_{c2}$

CURRENT WAVEFORM $I_{513}$
OF THE TRANSISTOR 513
AND OFFSET CURREN $\Delta I$

CURRENT WAVEFORM $I_{111}$
OF THE TRANSISTOR 111

CURRENT WAVEFORM $I_{112}$
OF THE TRANSISTOR 112

OUTPUT SIGNAL
WAVEFORM $e_o$
AND LIMITING LEVEL 75,76 ered to a common connection point of the collectors of the constant current source transistors 113 and 114.

LIMITER CIRCUIT FOR LIMITING PULSIVE NOISES

BACKGROUND OF THE INVENTION

1. Field of the Invention

The present invention relates to a limiter circuit suitable for use in a vehicle mounted receiver such as car radio or vehicle mounted CB transceiver, and more particularly to a limiter circuit for limiting pulsive noises superimposed on a modulation signal.

2. Description of the Prior Art

A vehicle mounted receiver such as an AM/FM radio receiver or CB transceiver is apt to be influenced by pulsive noises generated from an internal combustion engine of the vehicle.

Accordingly, the vehicle mounted receiver usually incorporates in a demodulator a limiter circuit for limiting the pulsive noises.

A limiter circuit as shown in FIG. 1 has been known as the limiter circuit for that purpose. In FIG. 1, there are connected between an anode of a detecting diode 11 of a detector circuit, that is, a detection signal input terminal $T_1$ and a detection signal output terminal $T_2$ a limiting diode 21, dividing resistors 22 and 23 for dividing a modulation signal (demodulation signal) which is developed at the input terminal $T_1$ of the detection by the detecting diode 11 and a D.C. voltage to supply the divided signal and voltage to an anode of the limiting diode 21 and a filter circuit 30 which comprises resistors 31 and 32 and a large capacitance capacitor 33 for extracting only the D.C. voltage from the modulation signal and the D.C. voltage applied to an input terminal thereof to supply the D.C. voltage to a cathode of the limiting diode 21. During normal reception state, the limiting diode 21 is biased to be conductive, and it is cut off only when the pulsive noise is superimposed on the modulation signal and it exceeds an AM 100% modulation level so that the potential at the anode of the limiting diode 21 falls below the potential at the cathode thereof by the noise. In this manner, the noise is limited. One example of such prior art limiter circuit is disclosed in Japanese Patent Publication No. 15224/67 published Aug. 23, 1967 which was also assigned to the assignee of the present invention.

FIGS. 2A and 2B show waveforms for illustrating the operation of the limiter circuit. In FIGS. 2A and 2B, numeral 1 denotes a ground potential, 2 denotes a D.C. bias potential at the cathode of the limiting diode 21, 3 denotes a D.C. bias potential at the anode of the limiting diode, 4 denotes a modulation signal at AM carrier 100% modulation, 5 and 6 denote pulsive noises superimposed on the modulation signal 4, 4' denotes a modulation signal when AM carrier modulation does not reach 100%, and 5' and 6' denote pulsive noises superimposed on the modulation signal 4'.

In the limiter circuit shown in FIG. 1, a limiting level is determined by the A.C. voltage (AGC voltage) which depends on the level of the carrier. As a result, when the limiting level is set to the modulation signal amplitude at the AM 100% modulation as shown in FIG. 2A, the noise can be fully limited at the high modulation as shown in FIG. 2A but at the low modulation as shown in FIG. 2B the pulsive noise output is large relative to the modulation signal and the limiting effect is materially decreased.

If the limiting level is lowered in order to overcome the above difficulty, the modulation signal at the high modulation is limited and the waveform of the modulation signal is distorted. Accordingly, the limiting level has to have been compromised at an appropriate level.

Furthermore, as the demand for implementing electronic circuits by IC structures increases recently, it may also be desired to implement the circuit of FIG. 1 by an IC structure. In this case, the terminals $T_1$, $T_2$ and $T_3$ must be provided as terminal pins of the IC. This is contrary to the object of the IC of permitting inclusion of as many functions as possible with a limited number of IC pins. In addition, relatively large capacitance capacitors designated by 13, 24 and 33 must be off-chip mounted.

SUMMARY OF THE INVENTION

It is an object of the present invention to provide a limiter circuit which is easy to implement by an IC structure and a limiting level of which changes in accordance with a waveform of a modulation input signal.

In order to achieve the above object, in accordance with the present invention, there is provided circuit means for supplying biasing currents for a differential transistor pair of a differential amplifier by separate constant current sources and controlling the current sources in accordance with the waveform of the modulation input signal.

DESCRIPTION OF THE PREFERRED EMBODIMENTS

Figure 1:
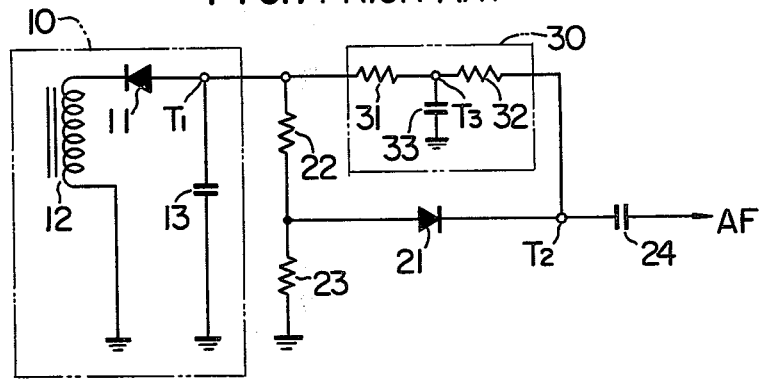
FIG. 1 shows a circuit diagram of a prior art limiter circuit.
Figure 2A:
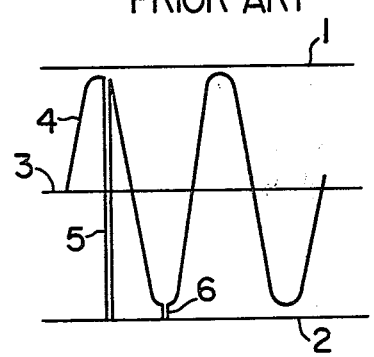
FIGS. 2A and 2B show waveforms for illustrating the operation of the circuit of FIG. 1.
Figure 2B:
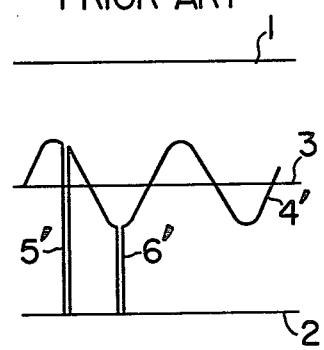
Figure 3:
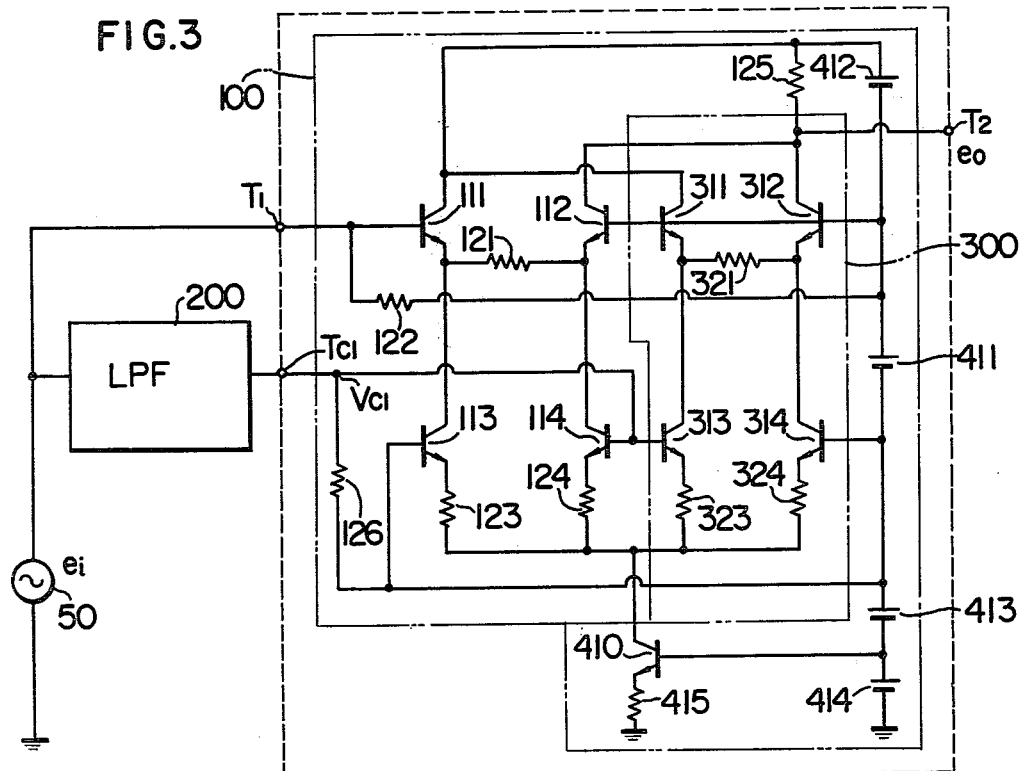
FIG. 3 shows a circuit diagram of a limiter circuit in accordance with one embodiment of the present invention.
Figure 4A:
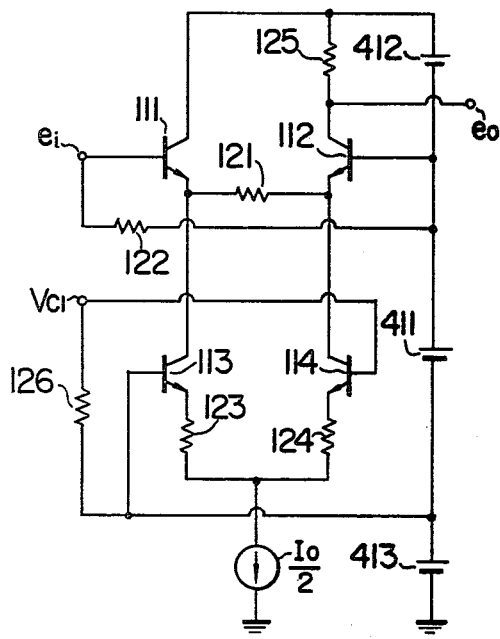
FIGS. 4A to 4D show equivalent circuits of FIG. 3.
Figure 4B:
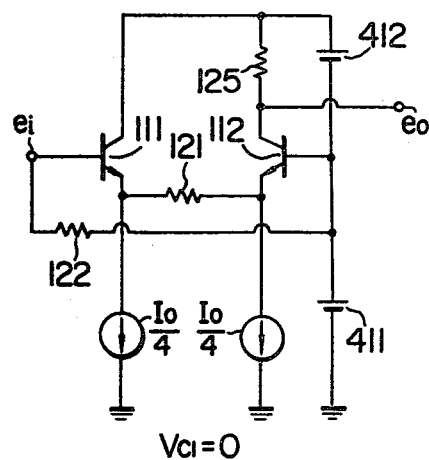
Figure 4C:
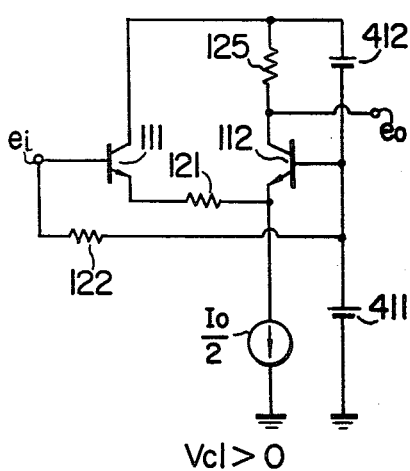
Figure 4D:
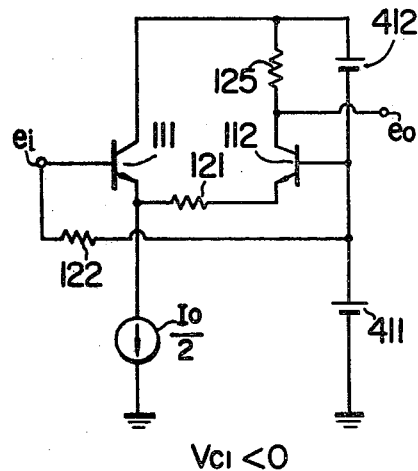

The present invention is now explained in detail with reference to the accompanying drawings. FIG. 3 is a circuit diagram of one embodiment of the present invention. In FIG. 3, numeral 50 denotes a modulation signal source, $T_1$ denotes a modulation signal input terminal to which a modulation signal $e_i$ is applied, and numeral 100 denotes an amplitude limiting amplifier circuit which comprises a pair of limiting differential transistors 111 and 112, a pair of constant current source differential transistors 113 and 114 connected in series with the differential transistor pair 111 and 112 to supply bias currents to those transistors, and a plurality of resistors 121-126. The base of the transistor 111 is connected to the input terminal $T_1$ and also connected to an operating power supply 411 through a biasing resistor 122. The collector of the transistor 111 is connected to an operating power supply 412 and the emitter thereof is connected to a collector of the transistor 113. The base of the transistor 112 is connected to the operating power supply 411. The collector of the transistor 112 is connected to the operating power supply 412 through a load resistor 125, and also connected to an output terminal T₂, and the emitter thereof is connected to the collector of the transistor 114. Those emitters of the transistors 111 and 112 are connected together through a resistor 121. The base of the transistor 113 is connected to an operating power supply 413 and the base of the transistor 114 is connected to the operating power supply 413 through a control terminal $T_{cl}$ and a resistor 126. Those emitters of the transistors 113 and 114 are connected to a constant current source transistor 410 through resistors 123 and 124, respectively. The base of the transistor 410 is connected to an operating power supply 414 and the emitter thereof in grounded through a resistor 415. Since the transistors 113 and 114 serve as a constant current source, an input signal current at the input terminal $T_1$ flows through the circuit including the transistor 111, the resistor 121 and the transistor 112. Thus, by varying bias currents to the transistors 111 and 112, more appropriate limiting level can be obtained.

Numeral 200 denotes a low-pass filter which is connected between the modulation signal input terminal $T_1$ and the control terminal $T_{cl}$ and conducts the modulation signal input $e_i$ to the control terminal $T_{cl}$ while eliminating the pulsive noises superimposed on the modulation signal. The filter 200 may be a conventional one.

Numeral 300 denotes a bias compensation circuit which compensates for the change of bias at the output terminal $T_2$ when the base potentials of the pair of current source differential transistors 113 and 114 in the amplifier circuit 100 are controlled by the control signal (modulation signal) at the control terminal $T_{cl}$ to control the bias currents of the pair of limiting differential transistors 111 and 112, that is, compensates for the biases to prevent the change of control signal $V_{cl}$ from appearing at the output terminal $T_2$. The circuit 300 comprises differential transistor pairs 311, 312 and 313, 314 which are connected in parallel with the differential transistor pairs 111, 112 and 113, 114, respectively, of the amplifier circuit and of the same circuit configuration as those transistor pairs. The bases of the transistors 311 and 312 are both connected to the operating power supply 411 and these emitters thereof are connected together through a resistor 321. The collector of the transistor 311 is connected to the collector of the transistor 111 and the collector of the transistor 312 is connected to the collector of the transistor 112. The base of the transistor 313 is connected to the control terminal $T_{cl}$ and the collector thereof is connected to the emitter of the transistor 311. The base of the transistor 314 is connected to the operating power supply 413 and the collector thereof is connected to the emitter of the transistor 312. The emitters of the transistors 313 and 314 are connected to the collector of the constant current source transistor 410 through resistors 323 and 324, respectively. The resistances of the resistors 123, 124, 323 and 324 are selected to be equal so that the current flowing through the transistors 114, 313 and 113, 314 are equal, and the resistances of the resistors 121 and 321 are selected to be equal so that the currents flowing through the transistors 112, 311 and 111, 312 are equal, whereby a constant bias current continuously flows through the load resistor 125.

In the circuit arrangement described above, the limiting characteristic described above is attained by applying the input signal having the pulsive noises eliminated by the low-pass filter 200 to the control terminal $T_{cl}$ as the control signal $V_{cl}$.

Figure 5A:
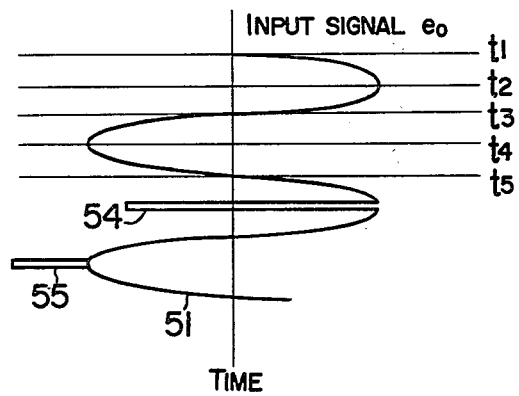
FIGS. 5A to 5C show characteristic curves for illustrating input-output characteristics in FIG. 3.
Figure 5B:
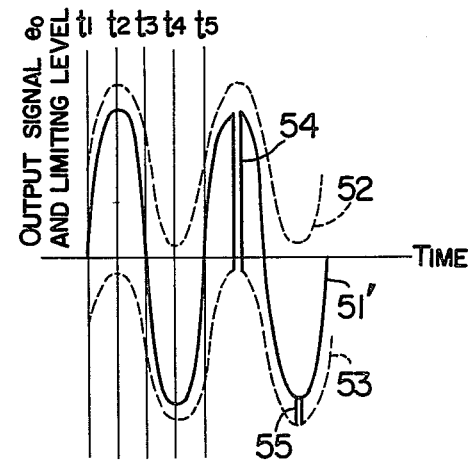
Figure 5C:
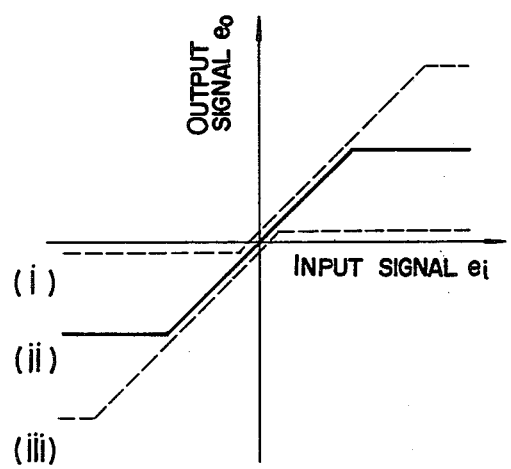

Referring to FIGS. 4 and 5, a principle of operation of the present circuit is explained. A circuit of FIG. 4A is obtained by eliminating the bias compensation circuit 300 from the circuit shown in FIG. 3. When a signal 51 as shown in FIG. 5A is applied to the control terminal $T_{cl}$ through the low-pass filter 200, the control signal $V_{cl}$ at the control terminal $T_{cl}$ and the input signal $e_i$ at the input terminal $T_1$ are zero at a time $t_1$ of the input waveform. Thus, a current of $I_o/4$ flows through each of the transistors 123 and 124, where $I_o$ is the constant current from the constant current transistor 410. The limiter circuit under this condition can be expressed by an equivalent circuit shown in FIG. 4B. Thus, the current of $I_o/4$ flows through each of the pair of limiting differential transistors 111 and 112 and an input-output characteristic exhibits symmetric limiting levels 52 and 53 with respect to zero axis as shown by a curve (ii) in FIG. 5C. A limiting level at a time $t_1$ of an output waveform 51' shown in FIG. 5B is determined thereby. At a time $t_2$ of the input waveform 51, the control signal $V_{cl}$ and the input signal $e_i$ are at a positive maximum value and a current of $I_o/2$ flows through the transistor 114 while no current flows through the transistor 113. The limiter circuit under this condition is expressed by an equivalent circuit shown in FIG. 4C. Thus, current of approximately $I_o/2$ flows through the transistor 112 of the pair of limiting differential transistors 111 and 112 while only small current flows through the other transistor 111. As a result, an input-output characteristic is such that an input current which is approximately twice as high as that at the time $t_1$ flows in the positive direction while small input current flows in the negative direction, as shown by a curve (i) in FIG. 5C. Thus, the limiting level at the time $t_2$ of the output waveform 51' increases by the factor of approximately 2 in the positive direction while the limiting level in the negative direction is approximately zero. Similarly, at a time $t_3$ of the input waveform 51, the limiter circuit is expressed by an equivalent circuit shown in FIG. 4B and an input-output characteristic exhibits a curve (ii) in FIG. 5C. At a time 4 of the input waveform 51, the control signal $V_{cl}$ and the modulation circuit $e_i$ are at negative maximum and a current of $I_o/2$ flows through the transistor 113 while no current flows through the transistor 114. The limiter circuit under this condition is expressed by an equivalent circuit shown in FIG. 4D. Thus, an input-output characteristic exhibits a curve (iii) in FIG. 5C. In this manner, for the sine wave input 51 shown in FIG. 5A, the sine wave output 51' shown in FIG. 5B and the limiting levels 52 and 53 shown by dotted curves which vary in accordance with sine wave are obtained.

In the present circuit, since the limiter levels are set by changing the bias levels of the pair of differential transistors 111 and 112, the positive and negative limiting level waveforms in FIG. 5B cannot be changed beyond the bias voltage. However, it has been proved that the present circuit can attain the improvement of approximately 6 dB over the conventional circuit.

As described above, although the limiting levels 52 and 53 change by the control signal $V_{cl}$ applied to the control terminal $T_{cl}$, those changes do not influence the output current at the output terminal $T_2$ by the function of the bias compensation circuit 300. Accordingly, no matter what waveform is applied to the control terminal $T_{c1}$, it is not material so long as it does not clip the output signal 51'. In an extreme case, it may be a square wave, in which case a noise limiting effect is substantially same. Accordingly, even if the low-pass filter 200 is of so simple configuration that it cannot fully eliminate the pulsive noises, the limiter circuit of the present invention can fully eliminate the noises.

Figure 6:
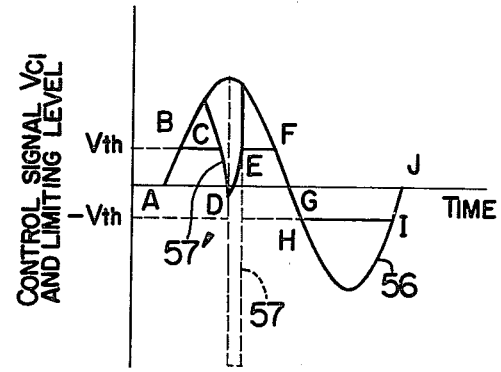
FIGS. 6 and 7 show waveforms used to explain the present invention.

More specifically, as shown in FIG. 6, by selecting the amplitude of the control signal 56 ($V_{c1}$) applied to the control terminal $T_{c1}$ from the low-pass filter 200 to be larger enough than a level $V_{th}$ at which the pair of differential transistors 113 and 114 switch, the signal for causing the change of the limiting level is a square wave as shown by a curve A B C D E I J. Assuming that the low-pass filter 200 is of so simple configuration and the characteristics thereof is so poor that a pulsive noise 57 superimposed on the control signal 56 cannot be fully eliminated but can only be attenuated to the extent shown by a waveform 57', the waveform of the signal for causing the change of the limiting level now change to a curve A B C D E F G H I J. That is, the changes of the limiting levels 52 and 53 shown in FIG. 5B are shown by the curve A B C D E F G H I J in FIG. 6.

Figure 7:
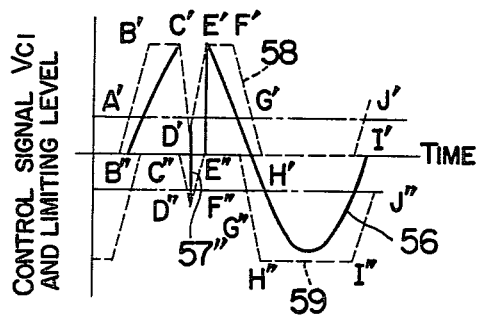

This is illustrated in FIG. 7. By the waveform shown by the curve A–J in FIG. 6, the upper limiting level 58 changes as shown by a curve A'–J', and the lower limiting level 59 similarly changes as shown by a curve A''–J''. Thus, the pulsive noise 57 superimposed on the control signal 56 in FIG. 6 is limited between the levels 58 and 59 so that it is compressed to a noise 57'' having an amplitude of $2\Delta I$. Accordingly, even with the low-pass filter 200 of simple configuration, the circuit can fully attain the noise limiting effect.

The bias compensation operation is now explained. In the circuit of FIG. 3, when the signal is absent, that is, when the input signal $e_i$ at the input terminal $T_1$ and the control signal $V_{c1}$ at the control terminal $T_{c1}$ are zero, the current of $I_o/4$ flows through the transistors 111, 112, 113, 114 and 311, 312, 313, 314, respectively, where $I_o$ is the constant current supplied from the constant current source transistor 410, and the sum current $I_o/2$ of the currents through the transistors 112 and 312 flows through the load resistor 125 and hence the output terminal $T_2$.

As the input signal $e_i$ is applied to the input terminal $T_1$ and the control signal $V_{c1}$ is applied to the control terminal $T_{c1}$ and the latter increases from zero, for example, the currents in the transistor 114 of the amplifier circuit 100 and the current in the transistor 313 of the bias compensation circuit 300 increase accordingly. On the other hand, the current in the transistor 113 of the amplifier circuit 100 and the current in the transistor 314 of the bias compensation circuit 300 decrease by the amounts corresponding to the increments of the currents in the transistors 114 and 313. As a result, the current in the transistor 112 of the amplifier circuit 100 and the current in the transistor 311 of the bias compensation circuit also increase while the current in the transistor 111 of the amplifier circuit 100 and the current in the transistor 312 of the bias compensation circuit 300 decrease. By selecting the resistances of the resistors 121 and 321 connected between the emitters of the transistors 111 and 112 and between the emitters of the transistors 311 and 312, respectively, to be equal to each other, equal current flows through the transistors 112, 311 and 111, 312, respectively. Therefore, the current flowing through the output terminal $T_2$ does not change. For example, if the current flowing through the transistors 114 and 313 increased by $\Delta I_o$ to reach $(I_o/4+\Delta I_o)$, the same magnitude of current $(I_o/4+\Delta I_o)$ flows through the transistors 112 and 311 and a current of $(I_o/4-\Delta I_o)$ flows through the transistors 113, 314 and 111, 312. Accordingly, the current flowing through the output terminal $T_2$ is equal to $(I_o/4+\Delta I_o)+(I_o/4-\Delta I_o)=I_o/2$. Thus, the bias current is kept constant for the change of the control signal $V_{c1}$.

Figure 8:
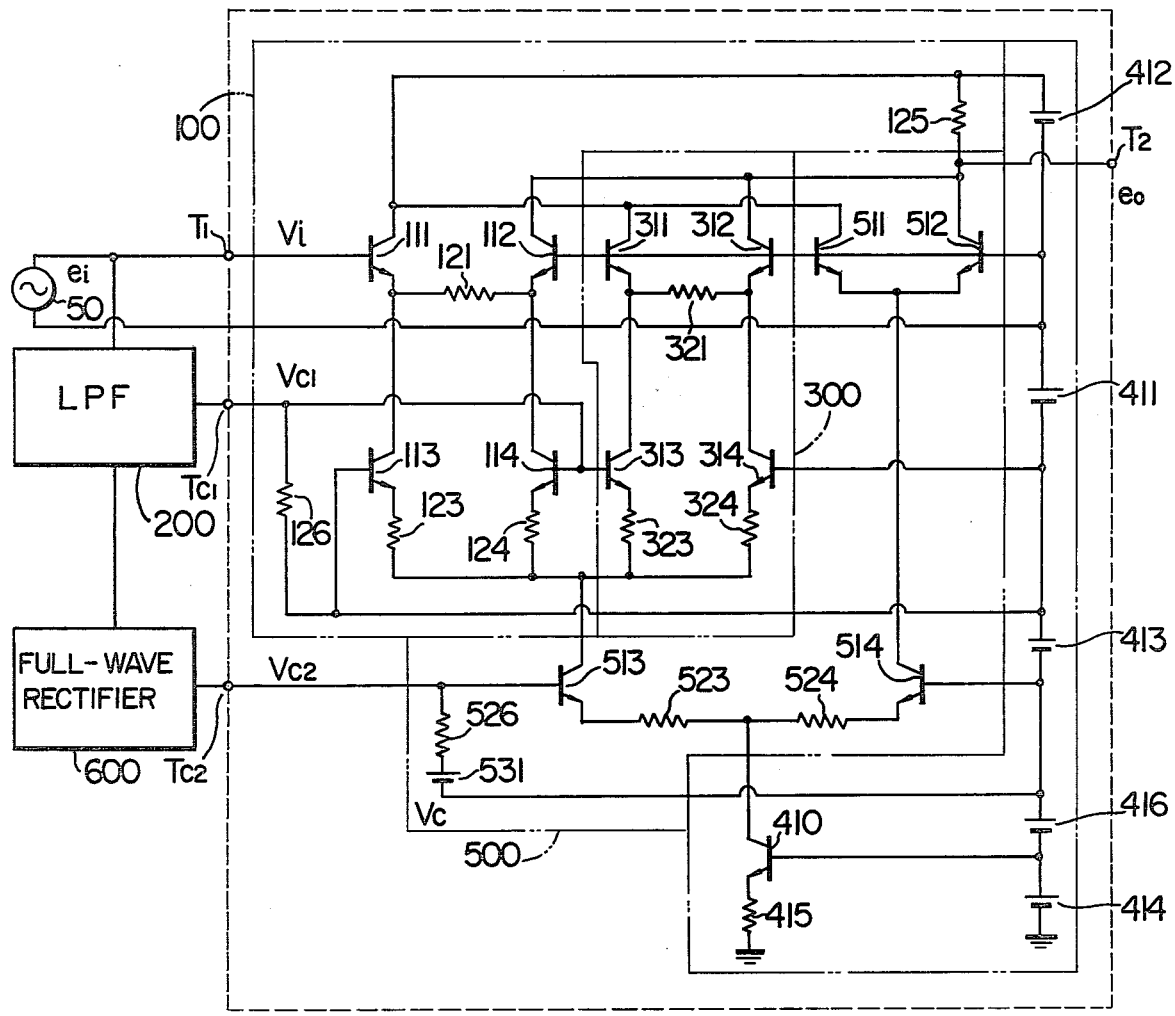
FIG. 8 is a circuit diagram of a limiter circuit in accordance with another embodiment of the present invention.

FIG. 8 shows a limiter circuit in accordance with another embodiment of the present invention which improves the limiting effect at the low modulation. In FIG. 8, the like parts to those shown in FIG. 3 are designated by the like numerals and they are not explained here. In FIG. 8, numeral 500 denotes a circuit for improving the limiting effect at the low modulation and it comprises transistors 511, 512, 513 and 514 which constitute the circuit for improving the limiting effect at the low modulation. The bases of the pair of differential transistors 511 and 512 are connected to the operating power supply 411 and the emitters thereof are connected together. The collector of the transistor 511 is connected to the collectors of the transistors 111 and 311 and the collector of the transistor 512 is connected to the collectors of the transistors 112 and 312. The base of the transistor 513 of the pair of differential transistors 513 and 514 is connected to a control terminal $T_{c2}$ and also connected to an operating power supply 416 through a resistor 526 and an offset power supply 531 ($V_c$). The collector thereof is connected to the emitters of the pair of differential transistors 113 and 114 of the amplifier circuit 100 and the emitters of the pair of differential transistors 313 and 314 of the bias compensation circuit 300 through the emitter resistors 123, 124 and 323, 324, respectively, and the emitter of the transistor 513 is connected to the collector of the constant current source transistor 410 through a resistor 523. The base of the transistor 514 is connected to the operating power supply 416, the collector thereof is connected to the emitters of the transistors 511 and 512 and the emitter thereof is connected to the collector of the constant current source transistor 410 through a resistor 524.

Numeral 600 denotes a full-wave rectifier circuit which is connected between the low-pass filter 200 and the control terminal $T_{c2}$ and full-wave rectifies the input signal (modulation signal) from the filter 200 and supplies the resulting pulsating voltage to the control terminal $T_{c2}$ as a control signal $V_{c2}$. The pulsating voltage derived from the full-wave rectifier circuit 600 changes in proportion to the magnitude of the modulation signal $e_i$ applied to the input terminal $T_1$, that is, a percentage modulation. This pulsating voltage acts as the control voltage $V_{c2}$ which controls an operating current flowing through the transistor 513 of the limiting effect improving circuit 500 in accordance with a level of the pulsating voltage and controls the input-output characteristic of the amplifier circuit 100, that is, the limiting level.

The operation of the circuit of FIG. 8 is now explained. In FIG. 8, assuming that the constant current source transistor 410 supplies a constant current of $I_o$ when the control signals $V_{c1}$ and $V_{c2}$ are zero, a current of $I_o/2$ flows through the transistors 513 and 514 respectively and a current of $I_o/8$ flows through the transistors 113, 114, 313 and 314, respectively. Those currents flow into the transistors 111, 112, 311 and 312 as they are if the input voltage $V_i$ at the input terminal $T_1$ is zero. A current of $I_o/4$ flows into the transistors 511 and 512, respectively. A sum current of the currents from the transistors 112, 314 and 514, that is, $I_o/8 + I_o/8 + I_o/4 = I_o/2$ flows through the resistor 125 and hence the output terminal $T_2$.

When the control signal $V_{c1}$ at the control terminal $T_{c1}$ increases from zero, the currents in the transistors 114, 313 and 112, 311 increase while the currents in the transistors 113, 314 and 111, 312 decrease by the amounts corresponding to the increments, like in the circuit shown in FIG. 3.

When the control signal $V_{c2}$ at the control terminal $T_{c2}$ increases from zero, the current in the transistor 513 increases in accordance with the level of the control signal $V_{c2}$ and the currents in the respective transistors of the amplifier circuit 100 and the bias compensation circuit 300 also increase. The current in the transistor 514 decreases by the amount corresponding to the current increment in the transistor 513 and the currents in the transistors 511 and 512 also decrease accordingly. For example, if the current in the transistor 513 increases by $\Delta I_o$ to reach $(I_o/2 + \Delta I_o)$, a current of $(I_o/8 + \Delta I_o/4)$ flows into the transistors 113, 114, 313, 314 and 111, 112, 311, 312, respectively, a current of $(I_o/2 - \Delta I_o)$ flows into the transistor 514, and a current of $(I_o/4 - \Delta I_o/2)$ flows into the transistors 511 and 512, respectively. Accordingly, a current of $(I_o/8 + \Delta I_o/4) + (I_o/8 + \Delta I_o/4) + (I_o/4 - \Delta I_o/2) = I_o/2$ flows into the output terminal $T_2$ and hence there occurs no change in the output current.

Thus, even if the control signals $V_{c1}$ and $V_{c2}$ change, this change does not appear at the output terminal $T_2$.

The limiting operation to the input voltage $V_i$ of the input signal $e_i$ under the above condition is now explained.

When the input voltage $V_i$ of the input signal $e_i$ and the control signals $V_{c1}$ and $V_{c2}$ are zero, the current of $I_o/8$ flows into the pair of limiting differential transistors 111 and 112 as described above, and no current flows through the resistor 121.

When the input voltage $V_i$ of the input signal $e_i$ changes in the positive direction from zero, that is, during a positive half cycle of the input signal $e_i$, the current in the transistor 111 increases while the current in the transistor 112 decreases. However, since the control signal $V_{c1}$ does not change, the transistors 113 and 114 each supplies the current of $I_o/8$ as the constant current source. Thus, the current increment beyond $I_o/8$ in the current of the transistor 111 flows into the transistor 114 through the resistor 121 and the current in the transistor 112 decreases by the amount corresponding to that increment. When the current in the transistor 111 reaches $I_o/4$ from $I_o/8$, the current flowing into the transistor 114 from the resistor 121 reaches $I_o/8$ while the current in the transistor 112 reaches zero and the transistor 112 is cut off.

Similarly, when the input voltage $V_i$ of the input signal $e_i$ changes in a negative direction from zero, that is, during a negative half cycle of the input signal $e_i$, the current in the transistor 111 decreases this time while the current in the transistor 112 increases. When the current flowing into the resistor 121 from the transistor 112 reaches $I_o/4$, the transistor 111 is cut off.

In this manner, when one of the transistors 111 and 112 are cut off, the current in the other transistor ceases to increase even if the input voltage $V_i$ further increases. That is, the currents in the transistors 111 and 112 can change only $\pm I_o/8$ from the initial current $I_o/8$ no matter how the input voltage $V_i$ changes, and the current at the output terminal $T_2$ can change only $\pm I_o/8$ from the initial current $I_o/2$.

When the control signal (voltage) $V_{c2}$ at the control terminal $T_{c2}$ changes, the operation is the same as that described in connection with the embodiment of FIG. 3, and hence the description thereof is omitted.

Figure 9:
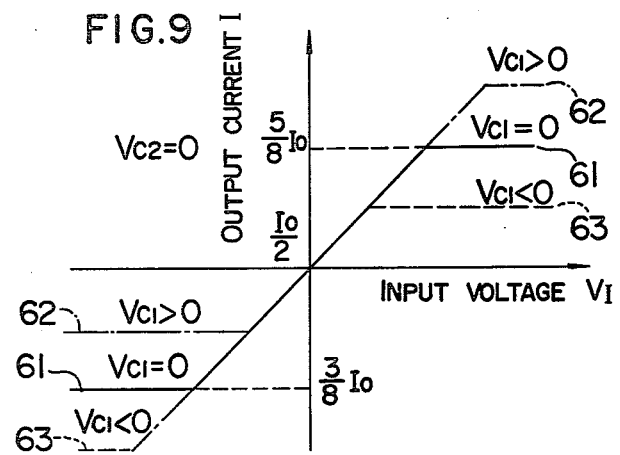

FIG. 9 is a characteristic chart of an input-output characteristic of the transistors 111 and 112 to the control signal $V_{c1}$, in which an abscissa represents the input voltage $V_i$ at the input terminal $T_1$ and an ordinate represents an output current I from the pair of limiting differential transistors 111 and 112. In FIG. 9, characteristic curves 61, 62 and 63 represent characteristics when the control signal $V_{c1}$ is zero, positive and negative, respectively. It is seen from the characteristic curves 61, 62 and 63 in FIG. 9 that the limiting level changes depending on whether the control signal $V_{c1}$ is zero, positive or negative. Thus, by controlling the control signal $V_{c1}$, the input-output characteristic of the transistors 111 and 112 can be controlled to control the limiting level.

The case where the control signal (voltage) $V_{c2}$ at the control terminal $T_{c2}$ increases from zero is explained. As the control signal $V_{c2}$ increases, the current in the transistor 513 increases from $I_o/2$ accordingly, while the current in the transistor 514 decreases accordingly. As stated above, the current at the output terminal $T_2$ does not change from $I_o/2$. Assuming that the increment of the current in the transistor 513 is equal to $\Delta I_o$, the current in the transistor 513 reaches $I_o/2 + \Delta I_o$ while the currents in the transistors 113, 114 and 111, 112 reach $I_o/8 + \Delta I_o/2$, respectively. Accordingly, the currents in the transistors 111 and 112 change within the range between $(I_o/8 + \Delta I_o/2)$ and $\pm(I_o/8 + \Delta I_o/2)$ in accordance with the input signal $V_i$, and the current at the output terminal $T_2$ changes within the range between $I_o/2$ and $\pm(I_o/8 + \Delta I_o/2)$. The current $\Delta I_o$ changes in accordance with the level of the control signal $V_{c2}$, i.e., the magnitude (percentage modulation) of the input signal at the input terminal $T_1$. Accordingly, the limiting levels of the transistors 111 and 112 can be changed in accordance with the magnitude of the input signal.

Figure 10:
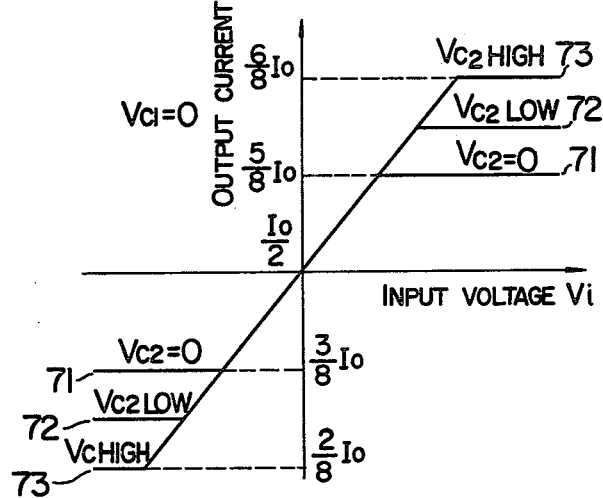
FIGS. 9 and 10 show characteristic curves for illustrating input-output characteristics of FIG. 8.

FIG. 10 shows a characteristic chart showing input-output characteristics of the transistors 111 and 112 to the control signal $V_{c2}$, in which an abscissa represents the input voltage $V_i$ at the input terminal $T_1$ and an ordinate represents the output current I of the pair of limiting differential transistors 111 and 112. In FIG. 10, characteristic curves 71, 72 and 73 represent the characteristics when the control signal $V_{c2}$ is zero, small and large, respectively.

It is seen from the characteristic curves 71, 72 and 73 shown in FIG. 10 that as the magnitude of the control signal $V_{c2}$ increases, a saturation level of the output current rises. Thus, by controlling the control signal $V_{c2}$, the input-output characteristics of the transistor 111 and 112 can be controlled to control the limiting levels.

Figure 11A:
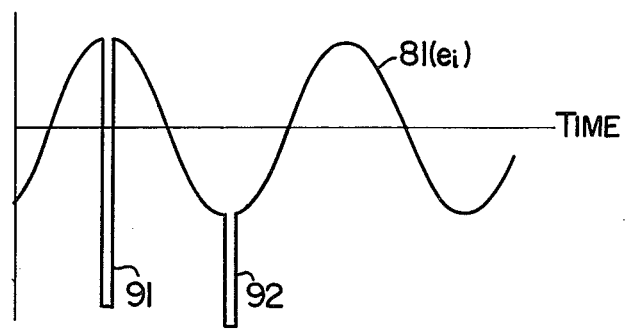
FIGS. 11A to 11F show waveforms used to explain the circuit of FIG. 8.
Figure 11B:
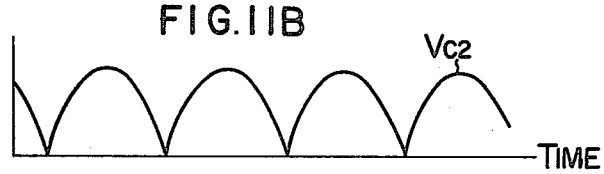
Figure 11C:
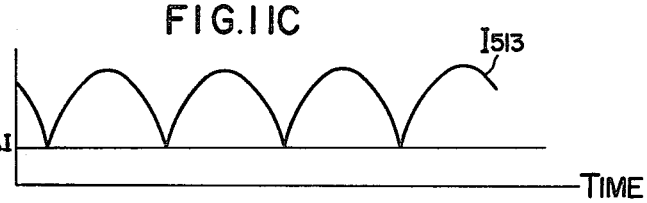
Figure 11D:
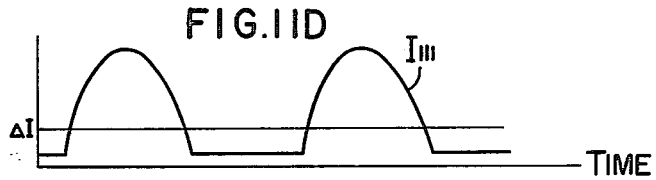
Figure 11E:
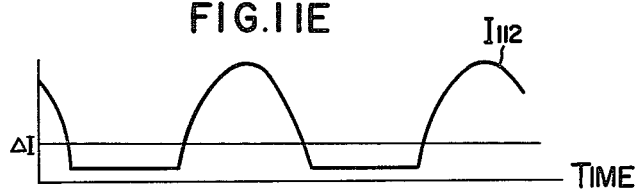
Figure 11F:
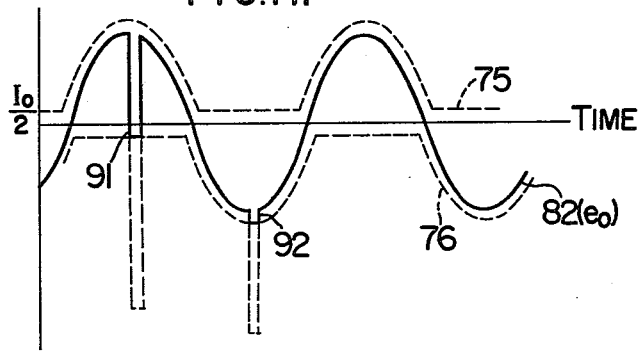

In the circuit arrangement shown in FIG. 8, when a modulation signal 81 ($e_i$) on which pulsive noises 91 and 92 are superimposed as shown in FIG. 11A is applied to the input terminal $T_1$, a control signal $V_{c2}$ of a waveform as shown in FIG. 11B appears at the control terminal $T_{c2}$. By this control signal $V_{c2}$, a current $I_{513}$ flowing in the transistor 113 assumes a waveform as shown in FIG. 11C. A current $\Delta I$ represents an initial current supplied by the offset power supply 531 ($V_c$). The current shown in FIG. 11C is distributed to the transistors 111 and 112 which constitute the limiting differential amplifier by the transistors 113 and 114 which are driven by the control voltage $V_{c1}$ applied to the control terminal $T_{c1}$. In order to simplify the explanation, it is assumed that the transistors 113 and 114 are switching by the control voltage $V_{c1}$. Then, current waveforms $I_{111}$ and $I_{112}$ of the transistors 111 and 112 assume the waveforms as shown in FIGS. 11D and 11E, respectively. The currents in the transistors 111 and 112 do not decrease to completely zero for the following reason. For example, when the transistor 114 is conductive, most parts of the current flow into the transistor 112 and that portion of the current in the transistor 114 which corresponds to the base-emitter voltage $V_{BE}$ of the transistor 112 flows into the transistor 111 through the resistor 121. However, the current portion is very small. Since the limiting level 75 to the positive half cycle of the signal $e_i$ applied to the pair of limiting differential transistors 111 and 112 corresponds to the bias current of the transistor 112 and the limiting level 76 to the negative half cycle corresponds to the bias current of the transistor 111 as described above, the limiting levels are established as shown in FIG. 11F and the signal 82 ($e_o$) is produced at the output terminal $T_2$ while it is limited between those levels without distortion.

As described above, since the limiting levels substantially coincide with the signal level, the signal is not deteriorated even if the signal level is low.

The magnitude of the current $\Delta I$ in the transistors 113 and 114 establishes the limiting level to the pulsive noise 92 which is superimposed on a peak of the signal 82, and it can be arbitrarily determined by the voltage $V_c$ of the offset power supply 531, and theoretically it does not provide a signal distortion with the signal 92 no matter how it is small. Thus, the pulsive noise 92 can be fully suppressed.

Since the limiting levels 75 and 76 changes to substantially follow the level of the input signal, that is, since the control signal $V_{c2}$ is changed in accordance with the modulation level of the input signal, as the signal level lowers, the limiting levels lower accordingly and hence the limiting levels to the pulsive noise 91 also lower, that is, they approach to the level of $I_o/2$. Therefore, the S/N ratio is not deteriorated when the signal level is low.

In general, an AM receiver includes a so-called AGC circuit which filters a detected signal by a low-pass filter to produce a D.C. control voltage and feed it back to an amplifier stage in a preceding stage of the detector circuit to control the gain of the amplifier stage. However, since the effect of AGC decreases as an input electric field is lowered, the level of the detected signal is lowered at a low electric field. This is true in an FM receiver.

However, according to the present embodiment, since the limiting level changes in accordance with the level of the demodulated signal, the S/N ratio is not deteriorated even at a low electric field.

Alternatively, the AGC control voltage may be superimposed on the voltage $V_c$ of the offset power supply 531. In this case, the S/N ratio is also not deteriorated even at a low electric field.

Furthermore, the application of the signal to the control terminal $T_{c1}$ may be stopped and instead a D.C. control signal derived by rectifying and filtering the signal may be applied to the voltage $V_c$ of the offset power supply 531 to change the limiting level in accordance with the signal level so that a high S/N ratio is obtained.

By changing the current $I_o$ of the constant current source 410, too, by utilizing the AGC control signal of the receiver, a greater noise limiting effect can be attained. In this case, the influence of the change of the current $I_o$ to the output can be readily prevented by providing an additional differential amplifier, in the same manner as in the embodiment of FIG. 8.

While the pairs of differential transistors 311, 312 and 313, 314 are configured completely symmetrically to the pairs of differential transistors 111, 112 and 113, 114 in order to prevent the output from changing by the input at the control terminal $T_{c1}$, the transistors 311 and 312 may be eliminated and the outputs of the transistors 313 and 314 may be directly connected to the collectors of the transistors 111 and 112. In this case, also, the control signal at the control terminal $T_{c1}$ does not appear at the output although the distortion of the signal at the output slightly increases. Therefore, the configuration can be simplified by eliminating the pair of differential transistors 311 and 312.

As described hereinabove, according to the present invention, a sufficient noise limiting effect can be attained without distorting the signal. Further, since there is no need to use a number of large capacitance capacitors, it is very easy to implement the circuit in an IC structure. Thus, an inexpensive noise limiter circuit which can fully suppress the noise to produce a high S/N signal even at a low electric field can be provided.

We claim:

1. A limiter circuit comprising:
an input terminal for receiving a modulation signal;
an output terminal from which an output signal is derived;
a first differential amplifier including first and second transistors having emitters thereof interconnected to each other through a resistor, a base of said first transistor being coupled to said input terminal;
a second differential amplifier including third and fourth transistors having emitters thereof interconnected to each other and collectors thereof connected in series with said emitters of said first and second transistors, respectively;
a constant current source connected to said commonly connected emitters of said third and fourth transistors for supplying a constant current to said first and second transistors of said first differential amplifier through said third and fourth transistors of said second differential amplifier;
load means connected to a collector of said second transistor to supply an output signal appearing at said collector of said second transistor to said output terminal;
bias source means including a first bias source for providing a first bias potential to bases of said first and second transistors and a second bias source for providing a second bias potential to bases of said third and fourth transistors;
a low-pass filter coupled to said input terminal to pass therethrough a modulation signal applied to said input terminal; and
circuit means for coupling an output from said low-pass filter to said bases of said third and fourth transistors and supplying to said bases of said third and fourth transistors the modulation signal which has passed through said low-pass filter.

2. A limiter circuit comprising:

an input terminal for receiving a modulation signal;

an output terminal from which an output signal is derived;

a differential amplifier circuit comprising a first differential amplifier including first and second transistors having emitters thereof interconnected to each other through a resistor, a base of said first transistor being coupled to said input terminal, and a second differential amplifier including third and fourth transistors having emitters thereof interconnected to each other and collectors thereof connected in series with said emitters of said first and second transistors, respectively;

a bias compensation circuit including fifth and sixth transistors having emitters thereof interconnected to each other and collectors thereof connected to collectors of said first and second transistors, respectively;

a constant current source connected to said commonly connected emitters of said third and fourth transistors and said fifth and sixth transistors, respectively, to supply a constant current to said third, fourth, fifth and sixth transistors;

load means connected to a collector of said second transistor to supply an output signal appearing at said collector of said second transistor to said output terminal;

bias source means including a first bias source for providing a first bias potential to bases of said first and second transistors, a second bias source for providing a second bias potential to bases of said third and fourth transistors, and a third bias source for providing a third bias potential to bases of said fifth and sixth transistors;

a low-pass filter coupled to said input terminal to pass therethrough said modulation signal applied to said input terminal; and circuit means for coupling an output from said low-pass filter to said bases of said third and fourth transistors and said fifth and sixth transistors to supply to said bases of those transistors the modulation signal which has passed through said low-pass filter.

3. A limiter circuit comprising:

an input terminal for receiving a modulation signal;

an output terminal from which an output signal is derived;

a differential amplifier circuit comprising a first differential amplifier including first and second transistors having emitters thereof interconnected through a resistor, a base of said first transistor being coupled to said modulation signal input terminal, and a second amplifier including third and fourth transistors having emitters thereof interconnected and collectors thereof connected in series with said emitters of said first and second transistors, respectively;

a bias compensation circuit comprising a third differential amplifier including fifth and sixth transistors having emitters thereof interconnected through a resistor and collectors thereof connected to collectors of said first and second transistors, respectively, and a fourth differential amplifier including seventh and eighth transistors having emitters thereof interconnected and collectors thereof connected in series with said emitters of said fifth and sixth transistors, respectively;

a constant current source connected to said emitters of said third and fourth transistors and said seventh and eighth transistors, respectively, to supply a constant current to those transistors;

a load means connected to a collector of said second transistor to supply an output signal appearing at said collector of said second transistor to said output terminal;

a bias source means including a first bias source for providing a first bias potential to bases of said first and second transistors, a second bias source for providing a second bias potential to bases of said third and fourth transistors, a third bias source for providing a third bias potential to bases of said fifth and sixth transistors, and a fourth bias source for providing a fourth bias potential to bases of said seventh and eighth transistors;

a low-pass filter coupled to said input terminal for passing therethrough said modulation signal applied to said input terminal; and circuit means for coupling an output from said low-pass filter to said bases of said third and fourth transistors and said seventh and eighth transistors, respectively, to supply to said bases of those transistors the modulation signal which has passed through said low-pass filter.

4. A limiter circuit comprising:

an input terminal for receiving a modulation signal;

an output terminal from which an output signal is derived;

a differential amplifier circuit comprising a first differential amplifier including first and second transistors having emitters thereof interconnected through a resistor, a base of said first transistor being coupled to said modulation signal input terminal, and a second differential amplifier including third and fourth transistors having emitters thereof interconnected and collectors thereof connected in series with said emitters of said first and second transistors, respectively;

a third differential amplifier including fifth and sixth transistors having emitters thereof interconnected and collectors thereof connected to said commonly connected emitters of said third and fourth transistors, said collector of said sixth transistor being connected to a collector of said second transistor;

a constant current source connected to said commonly connected emitters of said fifth and sixth transistors to supply a constant current to those transistors;

load means connected to said collector of said second transistor to supply an output signal appearing at said collector of said second transistor to said output terminal;

bias source means including a first bias source for providing a first bias potential to bases of said first and second transistors, a second bias source for providing a second bias potential to bases of said third and fourth transistors, and third bias means for providing a third bias potential to bases of said fifth and sixth transistors;

a low-pass filter coupled to said input terminal for passing therethrough said modulation signal applied to said input terminal;

first control circuit means for coupling an output of said low-pass filter to said bases of said third and fourth transistors to supply to said bases of those transistors the modulation signal which has passed through said low-pass filter to control the current source for those transistors in accordance with a waveform of said modulation signal;

a rectifier circuit coupled to said low-pass filter for full-wave rectifying said modulation signal which has passed through said low-pass filter to produce a rectified voltage corresponding to a percentage modulation of said modulation signal; and a second control circuit for coupling an output of said rectifier circuit to said bases of said fifth and sixth transistors to supply said rectified voltage produced at said rectifier circuit to said bases of those transistors to control the current source for those transistors in accordance with the percent modulation of said modulation signal.

5. A limiter circuit comprising:

an input terminal for receiving a modulation signal;

an output terminal from which an output signal is derived;

a differential amplifier circuit comprising a first amplifier amplifier including first and second transistors having emitters thereof interconnected through a resistor, a base of said first transistor being coupled to said modulation signal input terminal, and a second differential amplifier including third and fourth transistors having emitters thereof interconnected and collectors thereof connected in series with said emitters of said first and second transistors, respectively;

a bias compensation circuit including fifth and sixth transistors having emitters thereof interconnected and collectors thereof connected to collectors of said first and second transistors, respectively;

a limiter improving circuit comprising a fourth differential amplifier including seventh and eighth transistors having emitters interconnected and collectors thereof connected to said collectors of said first and second transistors, respectively, and a fifth differential amplifier including ninth and tenth transistors having emitters thereof interconnected, a collector of said ninth transistor being connected to said commonly connected emitters of said third and fourth transistors, a collector of said tenth transistor being connected to said commonly connected emitters of said seventh and eighth transistors;

a constant current source connected to said commonly connected ninth and tenth transistors to supply a constant current to those transistors;

load means connected to a collector of said second transistor for supplying an output signal appearing at said collector of said second transistor to said output terminal;

bias source means including a first bias source for providing a first bias potential to bases of said first and second transistors, a second bias source for providing a second bias potential to bases of said third and fourth transistors, a third bias source for providing a third bias potential to bases of said fifth and sixth transistors, a fourth bias source for providing a fourth bias potential to bases of said seventh and eighth transistors, and fifth bias means for providing a fifth bias potential to bases of said ninth and tenth transistors;

a low-pass filter coupled to said input terminal for passing therethrough said modulation signal applied to said input terminal;

first control circuit means for coupling an output of said low-pass filter to said bases of said third and fourth transistors and said fifth and sixth transistors, respectively, to supply to said bases of those transistors the modulation signal which has passed through said low-pass filter to control the current source for those transistors in accordance with a waveform of said modulation signal;

a rectifier circuit coupled to said low-pass filter for full-wave rectifying said modulation signal which has passed through said low-pass filter to produce a rectified signal corresponding to a percentage modulation of said modulation signal; and second control circuit means for coupling an output of said rectifier circuit to said bases of said ninth and tenth transistors to supply to said bases of those transistors said rectified voltage produced by said rectifier circuit to control the current source for those transistors.

6. A limiter circuit comprising:

an input terminal for receiving a modulation signal;

an output terminal from which an output signal is derived;

a differential amplifier circuit comprising a first differential amplifier including first and second transistors having emitters thereof interconnected through a resistor, a base of said first transistor being coupled to said modulation signal input terminal, and a second differential amplifier including third and fourth transistors having emitters interconnected and collectors thereof connected in series with said emitters of said first and second transistors, respectively;

a bias compensation circuit comprising a third differential amplifier including fifth and sixth transistors having emitters thereof interconnected through a resistor and collectors thereof connected to collectors of said first and second transistors, respectively, and a fourth differential amplifier including seventh and eighth transistors having emitters thereof interconnected and collectors thereof connected in series with said emitters of said fifth and sixth transistors, respectively;

a limiter improving circuit comprising a fifth differential amplifier including ninth and tenth transistors having emitters thereof interconnected and collectors thereof connected to said collectors of said first and second transistors, respectively, and a sixth differential amplifier including eleventh and twelveth transistors having emitters thereof interconnected, a collector of said eleventh transistor being connected to said commonly connected emitters of said third and fourth transistors and said seventh and eighth transistors, respectively, a collector of said twelveth transistor being connected to said commonly connected bases of said ninth and tenth transistors;

a constant current source connected to said commonly connected emitters of said eleventh and twelveth transistors to supply a constant current to those transistors;

load means connected to a collector of said second transistor for supplying an output signal appearing at said collector of said second transistor to said output terminal;

bias source means including a first bias source for providing a first bias potential to bases of said first and second transistors, a second bias source for providing a second bias potential to bases of said third and fourth transistors, a third bias source for providing a third bias potential to bases of said fifth and sixth transistors, a fourth bias source for providing a fourth bias potential to bases of said seventh and eighth transistors, a fifth bias source for providing a fifth bias potential to bases of said ninth and tenth transistors, and a sixth bias source for providing a sixth bias potential to bases of said eleventh and twelveth transistors;

a low-pass filter coupled to said input terminal for passing therethrough said modulation signal applied to said input terminal;

a first control circuit means for coupling an output of said low-pass filter to said bases of said third and fourth transistors and said seventh and eighth transistors, respectively, to supply to said bases of those transistors the modulation signal which has passed through said low-pass filter to control the current source for those transistors in accordance with a waveform of said modulation signal;

a rectifier circuit coupled to said low-pass filter for full-wave rectifying said modulation signal which has passed through said low-pass filter to produce a rectified voltage corresponding to a percent modulation of said modulation signal; and second control circuit means for coupling an output of said rectifier circuit to said bases of said eleventh and twelveth transistors for supplying to said bases of those transistors said rectified voltage produced by said rectifier circuit to control the current source for those transistors.

* * * * *